United States Patent
Komiyama

(10) Patent No.: US 10,046,664 B2
(45) Date of Patent: Aug. 14, 2018

(54) INTERNAL RESISTANCE ESTIMATION METHOD FOR SECONDARY BATTERY, OUTPUT CONTROL METHOD FOR SECONDARY BATTERY, AND VEHICLE

(71) Applicant: TOYOTA JIDOSHA KABUSHIKI KAISHA, Toyota-shi, Aichi-ken (JP)

(72) Inventor: Keita Komiyama, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 113 days.

(21) Appl. No.: 15/190,711

(22) Filed: Jun. 23, 2016

(65) Prior Publication Data

US 2016/0375790 A1    Dec. 29, 2016

(30) Foreign Application Priority Data

Jun. 25, 2015 (JP) ................. 2015-128092

(51) Int. Cl.
*H01M 10/44* (2006.01)
*H01M 10/46* (2006.01)
(Continued)

(52) U.S. Cl.
CPC ...... *B60L 11/1861* (2013.01); *G01R 31/3662* (2013.01); *H01M 10/48* (2013.01);
(Continued)

(58) Field of Classification Search
CPC .. H02J 7/021; H02J 7/026; H02J 7/047; H02J 7/0091; G01R 31/3606; G01R 31/3648; G01R 31/3658; G01R 31/3662
(Continued)

(56) References Cited

U.S. PATENT DOCUMENTS

| 2006/0152224 A1* | 7/2006 | Kim ................... G01R 31/3662 324/430 |
| 2009/0099802 A1 | 4/2009 | Barsoukov et al. |

(Continued)

FOREIGN PATENT DOCUMENTS

| JP | 2001-110459 A | 4/2001 |
| JP | 2005-93240 A | 4/2005 |

(Continued)

*Primary Examiner* — Edward Tso
(74) *Attorney, Agent, or Firm* — Sughrue Mion, PLLC

(57) ABSTRACT

An internal resistance estimation method for a secondary battery includes: acquiring an initial internal resistance value and temperature course information including a battery temperature and time information about time at which the battery temperature has been recorded; estimating an increased amount of the internal resistance value after a lapse of a predetermined time from the predetermined reference time on the basis of the temperature course information; estimating a reduced amount of the internal resistance value of the secondary battery resulting from a relative change between a range of use of a state of charge of the positive electrode and a range of use of a state of charge of the negative electrode on the basis of the temperature course information; and calculating an internal resistance variation in the lapse of the predetermined time on the basis of the increased amount and the reduced amount.

9 Claims, 7 Drawing Sheets

(51) Int. Cl.
*B60L 11/18* (2006.01)
*H02J 7/00* (2006.01)
*G01R 31/36* (2006.01)
*H01M 10/48* (2006.01)
*H01M 10/42* (2006.01)
*H01M 10/052* (2010.01)
*H01M 10/06* (2006.01)
*H01M 10/34* (2006.01)

(52) U.S. Cl.
CPC ........ *H02J 7/0063* (2013.01); *G01R 31/3648* (2013.01); *G01R 31/3675* (2013.01); *H01M 10/052* (2013.01); *H01M 10/06* (2013.01); *H01M 10/345* (2013.01); *H01M 10/484* (2013.01); *H01M 10/486* (2013.01); *H01M 2010/4278* (2013.01); *H01M 2220/20* (2013.01); *H02J 2007/0067* (2013.01); *Y02E 60/122* (2013.01); *Y02E 60/124* (2013.01); *Y02E 60/126* (2013.01)

(58) Field of Classification Search
USPC ....... 320/104, 128, 132, 130, 135, 149, 150; 324/430, 433
See application file for complete search history.

(56) References Cited

U.S. PATENT DOCUMENTS

2014/0222358 A1 8/2014 Morita et al.
2016/0259011 A1* 9/2016 Joe ..................... G01R 31/3651

FOREIGN PATENT DOCUMENTS

| | | |
|---|---|---|
| JP | 2012-185122 A | 9/2012 |
| JP | 2014-59251 A | 4/2014 |
| JP | 2014-149280 A | 8/2014 |
| WO | 2013/031558 A1 | 3/2013 |

* cited by examiner

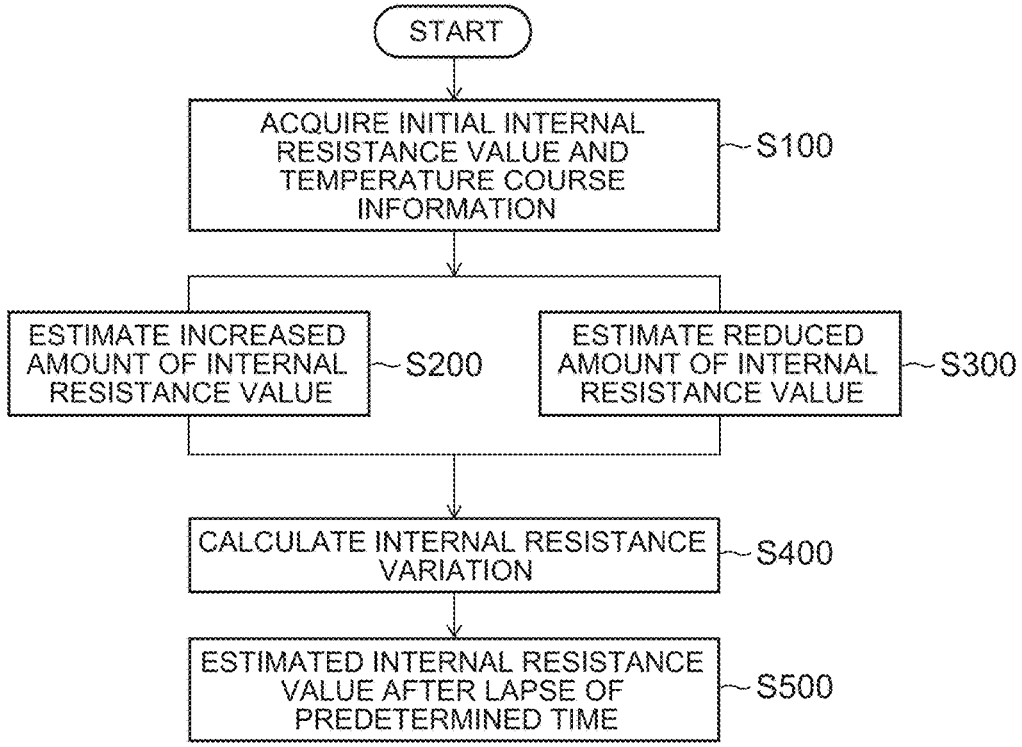
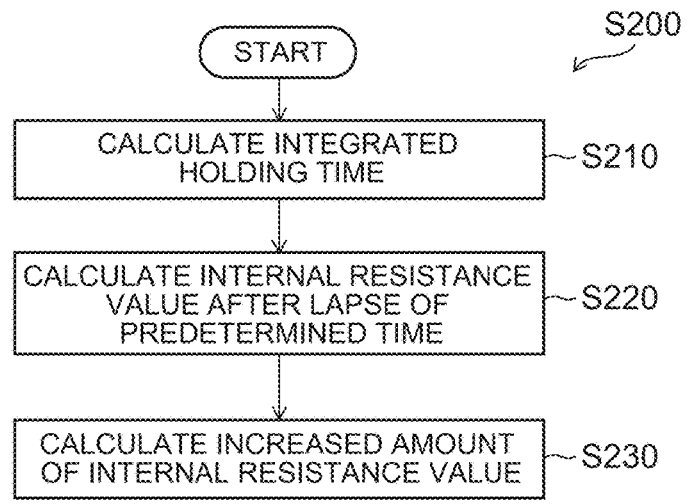

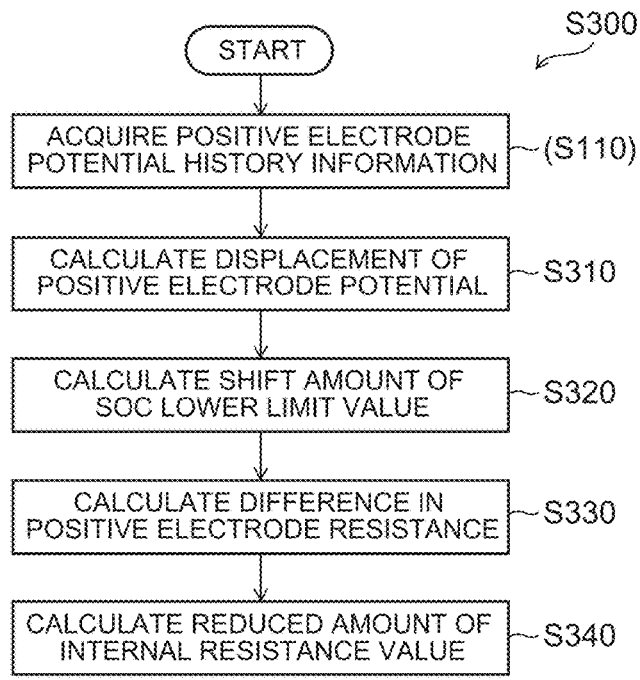
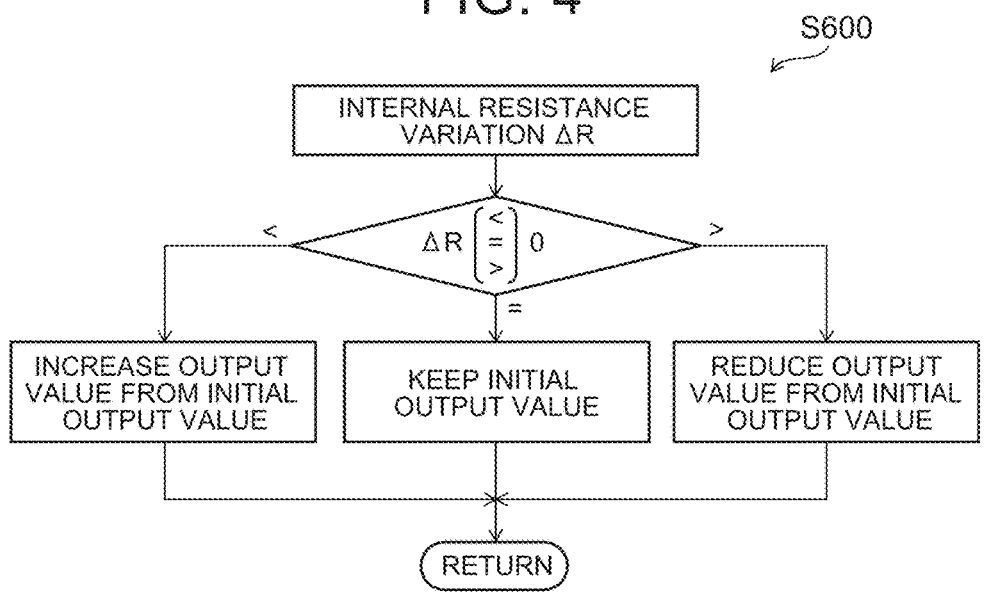

INTERNAL RESISTANCE ESTIMATION METHOD FOR SECONDARY BATTERY, OUTPUT CONTROL METHOD FOR SECONDARY BATTERY, AND VEHICLE

INCORPORATION BY REFERENCE

The disclosure of Japanese Patent Application No. 2015-128092 filed on Jun. 25, 2015 including the specification, drawings and abstract is incorporated herein by reference in its entirety.

BACKGROUND OF THE INVENTION

1. Field of the Invention

The invention relates to an internal resistance estimation method of estimating an internal resistance of a secondary battery on the basis of a usage state of a secondary battery, an output control method for a secondary battery, which utilizes the internal resistance estimation method, and a vehicle that uses the output control method.

2. Description of Related Art

A nonaqueous electrolyte secondary battery is lighter in weight and higher in energy density than an existing battery, so the nonaqueous electrolyte secondary battery is favorably utilized as, for example, a vehicle-mounted high-power power supply. Particularly, in an application in which high-power density is required, a lithium ion secondary battery is favorably used. It is generally known that a secondary battery degrades as a result of usage of the secondary battery. A main cause of the degradation is presumably an increase in the internal resistance of a cell resulting from repeated charging and discharging of the secondary battery. As the internal resistance increases, the capacity of the secondary battery, of course, decreases, and a discharging rate, temperature characteristics, and the like, can decrease. For this reason, there is suggested a method of estimating the degree of degradation of a secondary battery at the time when the secondary battery is used (see, for example, Japanese Patent Application Publication No. 2014-149280 (JP 2014-149280 A) and Japanese Patent Application Publication No. 2012-185122 (JP 2012-185122 A)).

For example, JP 2014-149280 A describes an estimation method of estimating the degree of degradation of a secondary battery not during actual usage but from a charging or discharging curve under a certain condition without spending cost or time. In this estimation method, the degree of degradation is estimated on the basis of the amount of increase in the internal resistance of the secondary battery. If data measured at different temperatures are compared with each other, variations in analyzed results increase. Therefore, the internal resistance is divided into three components, that is, reaction resistance, ohmic resistance and diffusion resistance, these three components are corrected to those at a predetermined reference temperature, and then the degree of degradation is calculated. JP 2012-185122 A describes a method of calculating the degree of degradation of a secondary battery by taking an abnormality history into consideration in addition to the internal resistance value of the battery after usage. In JP 2012-185122 A, the degree of degradation is further accurately estimated by adding correction values of temperature and degree of charge based on the abnormality history to the normalized degree of degradation. The normalized degree of degradation is calculated by normalizing the internal resistance of each individual secondary battery to a predetermined reference temperature and a predetermined reference degree of charge.

SUMMARY OF THE INVENTION

However, the estimation method described in JP 2014-149280 A is an analysis intended for an extremely simplified battery behavior, so the estimation method does not support the case where further highly accurate estimation of the degree of degradation is required. In the technique described in JP 2012-185122 A, the degree of degradation is estimated in consideration of the abnormality history; however, there is still room for improvement in the accuracy of the estimation. An aspect of the invention provides a highly accurate or simpler internal resistance estimation method for a secondary battery. Another aspect of the invention utilizes the internal resistance estimation method for a secondary battery, and also provides a control method for a secondary battery, which enables more effective use of the secondary battery.

In the degradation estimation method for a secondary battery according to the related art, reusability of a used secondary battery is mainly evaluated. For this reason, the degree of degradation may be estimated while the procedure is significantly simplified in terms of safety. A secondary battery that is utilized as a power supply, or the like, for propelling a vehicle, for example, has a durability of about ten years as a target. A secondary battery that is utilized as a power supply for propelling a vehicle is controlled to be charged or discharged under a sufficiently restricted condition in order to secure user's safety at least during this durable period. For this reason, by further highly accurately estimating the degree of degradation of the secondary battery in real time, higher performance of the secondary battery can be exhibited while safety is secured.

The first aspect of the invention provides an internal resistance estimation method for a secondary battery, the secondary battery including a positive electrode and a negative electrode. The internal resistance estimation method includes: acquiring an initial internal resistance value of the secondary battery and temperature course information, the secondary battery being an evaluation object, the temperature course information including a battery temperature of the secondary battery in use and time information about time at which the battery temperature has been recorded, the initial internal resistance value being an internal resistance value of the secondary battery at predetermined reference time; estimating an increased amount of the internal resistance value of the secondary battery after a lapse of a predetermined time from the predetermined reference time, on the basis of the temperature course information; estimating a reduced amount of the internal resistance value of the secondary battery resulting from a relative change between a range of use of a state of charge of the positive electrode and a range of use of a state of charge of the negative electrode, in the lapse of the predetermined time from the predetermined reference time, on the basis of the temperature course information; calculating an internal resistance variation in the lapse of the predetermined time from the predetermined reference time, on the basis of the increased amount and the reduced amount; and obtaining an estimated internal resistance value of the secondary battery after the lapse of the predetermined time from the predetermined reference time, on the basis of the initial internal resistance value and the internal resistance variation.

According to the above aspect, the influence of a relative change (hereinafter, simply referred to as capacity deviation)

that can occur between the range of use of the state of charge of the positive electrode of the secondary battery and the range of use of the state of charge of the negative electrode of the secondary battery as a result of repeated charging and discharging of the secondary battery, on the internal resistance value of the secondary battery is taken into consideration. The range of use of the state of charge of each electrode may be regarded as the range of the ratio of use in charging or discharging of the secondary battery to the charged capacity of the electrode. That is, the internal resistance value of the secondary battery is estimated in consideration of an event that the resistance of the positive electrode is reduced with the capacity deviation and the internal resistance value reduces. The reduction in the internal resistance value resulting from the capacity deviation is not reflected in estimating the degree of degradation of the secondary battery in the related art. With the configuration according to the above aspect, for example, it is possible to further highly accurately estimate the internal resistance value of the secondary battery in consideration of an event that an amount of increase in the internal resistance value of the secondary battery becomes negative due to the capacity deviation. In this specification, using a secondary battery means charging or discharging the secondary battery under a predetermined condition.

The first aspect may include preparing first data including a relationship between a temperature of a standard secondary battery and a resistance increase coefficient. The standard secondary battery has the same specifications as the secondary battery. The resistance increase coefficient is an amount of increase in the internal resistance of the standard secondary battery per predetermined unit time. In the first aspect, the estimating the increased amount of the internal resistance value may include: calculating an integrated value of a holding time during which the secondary battery is held at each predetermined temperature, on the basis of the temperature course information; and calculating the increased amount of the internal resistance value of the secondary battery in the lapse of the predetermined time from the predetermined reference time, by using the integrated value of the holding time at each predetermined temperature and the resistance increase coefficient at each predetermined temperature.

In the above aspect, the calculating the increased amount of the internal resistance value may include: calculating the internal resistance value of the secondary battery after the lapse of the predetermined time from the reference time by using an integrated amount of the holding time at each temperature and the resistance increase coefficient at each temperature; and obtaining the increased amount of the internal resistance value on the basis of the internal resistance value of the secondary battery after the lapse of the predetermined time from the reference time, and the initial internal resistance value.

In the above aspect, the first data may include information regarding a relationship between the state of charge of the secondary battery and the resistance increase coefficient.

The resistance increase coefficient of the secondary battery may be substantially determined in accordance with a condition, such as an environmental temperature. The resistance increase coefficient may be regarded as a coefficient that increases with an increase in the rate of increase in internal resistance. It is possible to simply and highly accurately calculate an increased amount of the internal resistance value by utilizing the resistance increase coefficient and the integrated holding time during which the secondary battery is held at each temperature.

In the above aspect, the temperature course information may be acquired during any one of or a combination of two or more of the following periods (1) to (4): (1) during use of the battery; (2) during nonuse of the battery, and during a selected period from an end of use of the battery; (3) when a temperature difference between a maximum air temperature and a minimum air temperature of a day is larger than or equal to 10° C.; and (4) when variations in average temperature of a month are larger than or equal to 5° C.

An increase in resistance resulting from a temperature change can significantly contribute to an increase in the internal resistance of the secondary battery. In the above aspect, not only during use of the secondary battery but also when it is determined that the influence of a temperature change of the battery on the internal resistance is large even during nonuse of the battery, a temperature course at that time is also taken into consideration. In the above aspect, as described above, by utilizing the integrated holding time at each temperature, it is possible to simply reflect long-term temperature course information in calculating an amount of increase in the internal resistance value. Thus, it is possible to further highly accurately estimate the internal resistance value of the secondary battery.

The first aspect may include: preparing second data including a relationship among the temperature of the standard secondary battery, a state of charge of the standard secondary battery and a resistance value of a positive electrode of the standard secondary battery, the standard secondary battery having the same specifications as the secondary battery; and acquiring positive electrode potential history information including a potential of the positive electrode of the secondary battery during use of the secondary battery and time information about time at which the potential of the positive electrode of the secondary battery is recorded. In the first aspect, the estimating the reduced amount of the internal resistance value may include: calculating a displacement of the potential of the positive electrode of the secondary battery in the lapse of the predetermined time by subtracting a potential of the positive electrode of the secondary battery at the reference time from a potential of the positive electrode of the secondary battery after the lapse of the predetermined time from the reference time; when the displacement of the potential of the positive electrode of the secondary battery is a positive value, calculating a shift amount of a lower limit value of a state of charge of the secondary battery in the lapse of the predetermined time on the basis of the displacement of the potential of the positive electrode of the secondary battery; and obtaining a difference, as the reduced amount of the internal resistance value, by subtracting a resistance value of the positive electrode of the secondary battery when the state of charge of the secondary battery has increased, from a resistance value of the positive electrode of the secondary battery at the reference time, on the basis of the second data.

The first aspect may include: preparing second data including a relationship among the temperature of the standard secondary battery, a state of charge of the standard secondary battery and a resistance value of a positive electrode of the standard secondary battery, the standard secondary battery having the same specification as the secondary battery; and acquiring positive electrode potential history information including a potential of the positive electrode of the secondary battery during use of the secondary battery and time information about time at which the potential of the positive electrode of the secondary battery is recorded. In the first aspect, the estimating the reduced amount of the internal resistance value may include: calculating a shift amount of a lower limit value of the state of charge of the secondary battery in the lapse of the predetermined time by subtracting a state of charge of the secondary battery at the reference time in a state where the potential of the positive electrode of the secondary battery is at a lower limit, from a state of charge of the secondary battery after the lapse of the predetermined time in a state where the potential of the positive electrode of the secondary battery is at the lower limit; and obtaining a difference, as the reduced amount of the internal resistance value, by subtracting a resistance value of the positive electrode of the secondary battery when the state of charge of the secondary battery has increased by the shift amount from a resistance value of the positive electrode of the secondary battery at the reference time, on the basis of the second data.

According to the above aspects, it is possible to accurately and efficiently incorporate a reduction in the resistance of the positive electrode resulting from the capacity deviation into estimation of the internal resistance value of the secondary battery.

A second aspect of the invention provides an output control method for a secondary battery. The second aspect includes: where an internal resistance variation of the secondary battery after a lapse of a predetermined time from the predetermined reference time, calculated by the internal resistance estimation method according to the first aspect, is $\Delta R$, decreasing an output of the secondary battery when $\Delta R>0$; keeping the output of the secondary battery when $\Delta R=0$; and increasing the output of the secondary battery when $\Delta R<0$.

With the internal resistance estimation method for a secondary battery, for example, the case where the internal resistance value reduces as a whole can be estimated. By taking a reduction in the internal resistance value of the secondary battery into consideration, excessive evaluation of the degree of degradation is prevented or reduced, and, for example, it is possible to further appropriately control the output of the secondary battery in response to actual battery performance without imposing an excessive restriction. For this reason, for example, it may be possible to raise the output of the secondary battery as compared to the initial output. Therefore, it is possible to cause the secondary battery to effectively exhibit original performance.

A third aspect of the invention provides a vehicle. The vehicle according to the third aspect includes: a secondary battery that serves as a power supply for propelling the vehicle; and an output control circuit that executes output control over the secondary battery by the use of the output control method according to the second aspect.

For example, in a vehicle that is driven by the secondary battery according to the related art, the output of the secondary battery is controlled within the range lower than or equal to the initial output from the viewpoint of ensuring the durability of the secondary battery for about ten years from the start of use. In contrast, with the technique according to the aspect of the invention, even when the secondary battery is discharged at an output higher than the initial output, it is possible to achieve an output state where the degradation of the battery does not excessively advance. Thus, for example, it is possible to further appropriately execute output control in response to an actual degradation state of the battery without a restriction to the initial output of the secondary battery.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 1 is a flowchart that shows an internal resistance estimation method for a secondary battery according to an embodiment;

FIG. 2 is a flowchart that shows a further detailed embodiment of step S200 in FIG. 1;

FIG. 3 is a flowchart that shows a further detailed embodiment of step S300 in FIG. 1;

FIG. 4 is a flowchart that shows an output control method for a secondary battery according to the embodiment;

DETAILED DESCRIPTION OF EMBODIMENTS

Figure 5:
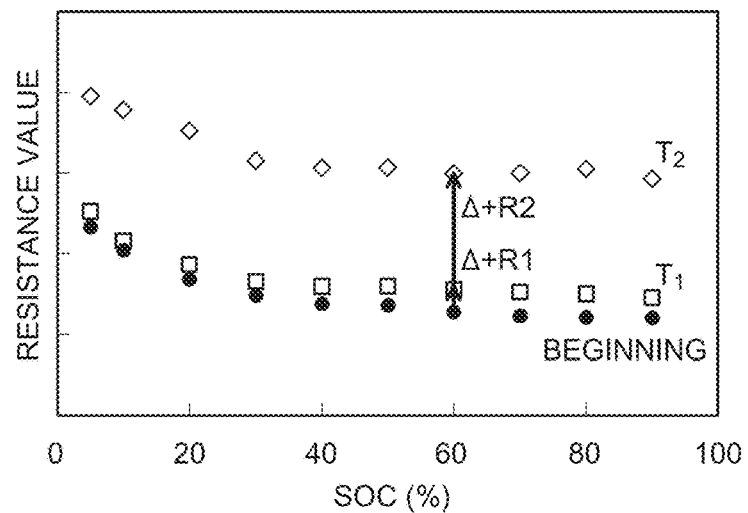
FIG. 5 is a graph that illustrates a state where an amount of increase in resistance is added to each of temperature ranges $T_1$, $T_2$ from an initial stage of evaluation in calculating an increased amount of an internal resistance value.

Hereinafter, a resistance estimation method for a secondary battery and its usage according to an embodiment of the invention will be described in detail with reference to the accompanying drawings as needed. Each of the drawings is schematically drawn, and numerical relation in each drawing (array, rate of change, and the like, of data in the graph) can substantially reflect one example of an actual relationship; however, it does not strictly show the actual relationship. Like reference numerals denote members and portions having the same operations, and the overlap description is omitted or simplified.

Internal Resistance Estimation Method for Secondary Battery

FIG. 1 is a flowchart that shows an internal resistance estimation method for a secondary battery according to the embodiment. The internal resistance estimation method for a secondary battery, described below, is a method of estimating the internal resistance of a secondary battery including a positive electrode and a negative electrode, and is characterized by including the following steps S100 to S500, as shown in FIG. 1.

The internal resistance estimation method according to the present embodiment includes: (S100) acquiring an initial internal resistance value of a secondary battery (hereinafter, simply referred to as secondary battery) that is an evaluation object and temperature course information including at least a battery temperature of the secondary battery in use and time information about time at which the battery temperature is recorded; (S200) estimating an increased amount of the internal resistance value of the secondary battery after a lapse of a predetermined time on the basis of the temperature course information; (S300) estimating a reduced amount of the internal resistance value of the secondary battery resulting from a relative change (capacity deviation) between the range of use of the state of charge of the positive electrode and the range of use of the state of charge of the negative electrode after a lapse of the predetermined time on the basis of the temperature course information; (S400) calculating an internal resistance variation after a lapse of the predetermined time on the basis of the increased amount of the internal resistance value and the reduced amount of the internal resistance value; and (S500) obtaining an estimated internal resistance value of the secondary battery after a lapse of the predetermined time on the basis of the initial internal resistance value and the internal resistance variation.

In the present embodiment, by calculating the internal resistance variation after a lapse of the predetermined time with respect to the initial internal resistance value while taking the temperature information to which the battery is exposed into consideration, it is possible to highly accurately acquire the internal resistance value of the secondary battery that has degraded as a result of a lapse of the predetermined time. In the above-described steps, step S200 and step S300 just need to be executed after step S100, and step S200 and step S300 may be respectively executed at selected mutually independent timings. Therefore, step S200 and step S300 may be executed at the same time (in parallel with each other) or any one of step S200 and step S300 may be executed first.

The secondary battery for which the internal resistance estimation method is intended is not specifically limited. For example, the internal resistance estimation method may be intended for various secondary batteries that are allowed to be subjected to repeated charging and discharging through migration of electrons resulting from migration of carriers between positive and negative electrodes. Examples of the secondary battery may conceivably include various secondary batteries, such as a lithium ion secondary battery, a lead storage battery and a nickel-metal hydride battery. Among others, the lithium ion secondary battery is a secondary battery that utilizes lithium ions as carriers, and can implement high energy density, so the lithium ion secondary battery can be a favorable example of the secondary battery for which the present technique is intended. Within the lithium ion secondary battery, a battery that uses a carbonaceous material, such as graphite, as a negative electrode active material is favorable because it is possible to suitably estimate the above-described reduced amount of the internal resistance value. Hereinafter, the present embodiment will be described, for example, on the basis of an example in which the internal resistance of a lithium ion secondary battery is estimated.

The lithium ion secondary battery includes opposed positive and negative electrodes, and an electrolyte including lithium ions that are supplied between these positive and negative electrodes. Each of the positive electrode and the negative electrode contains an active material that is able to store and release lithium ions. During charging of the battery, lithium ions are released from the positive electrode active material, and the lithium ions are captured into the negative electrode active material through the electrolyte. During discharging of the battery, on the contrary, lithium ions are released from the negative electrode active material, and the lithium ions are captured again into the positive electrode active material through the electrolyte. In this way, as a result of discharging of the battery to an external load or charging of the battery from an external charging device, lithium ions migrate between the positive electrode active material and the negative electrode active material in the lithium ion secondary battery.

S100: Acquisition of Temperature Course Information

In S100, the internal resistance value of the secondary battery that is an evaluation object (hereinafter, simply referred to as secondary battery, battery, or the like) at the initial point in time of an evaluation period is acquired as the initial internal resistance value. At the same time, temperature course information, including a battery temperature and time information about time at which the battery temperature is recorded, is acquired chronologically for the secondary battery. The battery temperature and the time information both are applicable as long as the temperature and time measured in the evaluation period are recognizable. For example, the battery temperature and the time information each may be acquired as a difference from the last measured value, that is, a temperature difference, a time difference, or the like. The temperature course information is desirably acquired at a predetermined frequency (desirably, intervals of one minute to 12 hours, for example, every 12 hours, every four hours, every three hours, every two hours, every one hour, every 30 minutes, every ten minutes, every one minute, any combination of these, or the like) at least during use of the battery.

A temperature condition to which a manufactured battery is exposed can change depending on a state, such as an external environment (for example, a country or a region) and a usage environment (an ambient temperature, an electrical device in which the battery is used). A temperature change of the battery influences battery performance, and particularly can significantly influence the internal resistance. Therefore, even when the battery is not charged or discharged (not used), the battery not in use can also be influenced by an environmental temperature. Therefore, in the present embodiment, not only during use, that is, when the battery is being charged or discharged, but also during nonuse of the battery, acquiring the temperature course information of the battery is a favorable mode.

The timing at which (the period during which) the temperature course information is acquired is not specifically limited; however, the temperature course information is desirably acquired in, for example, environments written in the following (1) to (4) as an environment that easily influences the degradation of the battery.

(1) During use of the battery
(2) During nonuse of the battery, and during a selected period from the end of use of the battery
(3) When a temperature difference between a maximum air temperature and a minimum air temperature of a day is larger than or equal to 10° C. (day)
(4) When variations in average temperature of a month are larger than or equal to 5° C. (month)

During use of the battery, electrochemical reaction occurs as a result of charging and discharging of the secondary battery. Therefore, degradation resulting from the use of the battery easily advances, so the temperature course information is absolutely acquired. During nonuse, that is, when the battery is not charged or discharged, and during a selected period (for example, one to ten hours, desirably two to five hours, and more desirably three to four hours) from the end of use of the battery, degradation due to the influence resulting from the use of the battery can advance, so it is desirable to acquire the temperature course information. When the temperature difference between the maximum air temperature and the minimum air temperature of a day is larger than or equal to 10° C. or when variations in the average temperature of a month are larger than or equal to 5° C., degradation due to an environmental temperature can advance, so it is desirable to acquire the temperature course information. Any one of the conditions (1) to (4) may be employed. Two or more of the conditions (1) to (4) may be employed in combination as needed. When any one condition is employed, it is desirable that the condition be (1) during use of the battery. For example, the temperature course information may be acquired not only (1) during use of the battery but also when any one of the conditions (2) to (4) is satisfied. Furthermore, the temperature course information may be acquired both during use of the battery and during nonuse of the battery. At the above-described timing as well, it is possible to acquire the temperature course information at appropriate frequency at appropriate intervals as in the case during use of the battery.

As the initial internal resistance value of the secondary battery, the internal resistance value of the secondary battery, measured by a known measurement method, such as IV resistance measurement, AC impedance measurement and current-rest method, in an initial stage of an evaluation period may be employed. For example, in a secondary battery including a known battery control system, generally, there is the one that manages a battery state by measuring the temperature, current, voltage, state of charge (SOC), capacity (for example, discharged capacity), and the like, of the battery in use from the viewpoint of ensuring safety. The battery state is managed for each individual battery or each plurality of batteries (each battery stack). The above-described temperature course information is allowed to be acquired by utilizing these data acquired by a known battery control system. For example, the temperature course information desirably acquires not only temperature information but also information about positive electrode potential and information about SOC, and the like. The internal resistance value may be acquired in parallel with management of these battery states. These measurements allow each piece of information of the battery (or battery stack) to be acquired at any timing by attaching temperature measurement means formed of a thermocouple, a thermistor, or the like, voltage measurement means, current measurement means, and the like, to each of one or a plurality of batteries.

Figure 9:
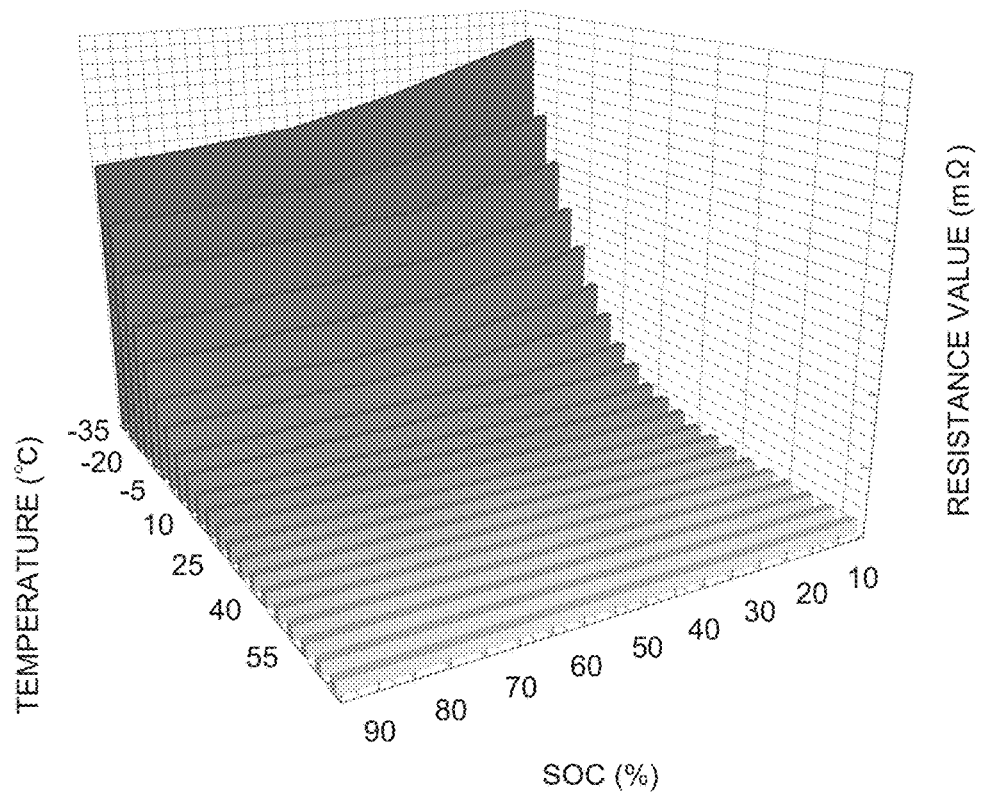
FIG. 9 is an example of a data map that shows the relationship among a temperature of the secondary battery, a state of charge (SOC) of the secondary battery and a resistance value at the temperature and the SOC.

The initial internal resistance value of the secondary battery may be acquired by previously investigating an internal resistance value of a standard secondary battery having the same specifications as the secondary battery that is the evaluation object in a predetermined temperature and SOC condition and then referencing that value. Such data regarding the initial internal resistance value are allowed to be prepared in a mode of a three-dimensional map (hereinafter, may be simply referred to as third data), or the like, as, for example, an initial internal resistance value-temperature-SOC relationship. For example, FIG. 9 shows an example of the third data. The relationship among the temperature, SOC and internal resistance value of the standard secondary battery is allowed to be measured in accordance with common procedure. Specifically, the IV resistance of the battery adjusted to a predetermined SOC state at a predetermined temperature should be measured. The IV resistance is defined as the slope of a line drawn by the I-V curve that shows the relationship between an open circuit potential (V) and a current value (I) flowing at that time, and is a value also called differential resistance, or the like. An IV resistance measurement method is not strictly limited. For example, a voltage variation at the time when the battery adjusted to a predetermined temperature and SOC state is charged or discharged for a certain time (for example, five seconds) at several current values (desirably, three or more points, for example, four points, that is, 0.1 C, 1 C, 2 C, 5 C, or the like) is measured with the use of a potentiostat, or the like, and the IV resistance can be the one obtained by calculating the slope of a voltage to a current value. This IV resistance can be, for example, an index that indicates how much ampere current the secondary battery is able to pass for the certain time. The relationship between an SOC and an IV resistance value is, for example, illustrated as an example by performing measurement at intervals of, for example, 1 to 5° C. in the range in which the battery temperature is from about −40° C. to 80° C. (for example, from about −35° C. to 60° C.). These values may be acquired at the same time when first data (described later) are created.

S200: Estimation of Increased Amount of Internal Resistance Value

In S200, an increased amount of the internal resistance value of the secondary battery after a lapse of an evaluation period (that is, a predetermined time) is estimated on the basis of the temperature course information. A method of estimating an increased amount of the internal resistance value of the secondary battery is not specifically limited. For example, an increased amount (Δ+R) of the internal resistance value is calculated by subtracting the initial internal resistance value ($R_i$) from the internal resistance value ($R_r$) that is estimated for the secondary battery after a lapse of the predetermined time. The internal resistance value ($R_r$) of the secondary battery after a lapse of the predetermined time is regarded as, for example, the internal resistance value resulting from accumulation of an amount of increase in resistance under each predetermined condition in which the secondary battery has been exposed, on the initial internal resistance value ($R_i$) of the secondary battery. An amount of increase in resistance under a predetermined condition is calculated as a product of the initial internal resistance value, a resistance increase coefficient ($\alpha$) of the condition and a time (t) during which the secondary battery has been exposed under the condition. That is, an increased amount (Δ+R) of the internal resistance value is, for example, estimated on the basis of the following mathematical expression (1).

$$\Delta+R = R_r - R_i = R_i \times (\Sigma(\alpha_x \times t_x) - 1) \tag{1}$$

In the above mathematical expression, Δ+R denotes an increased amount of the internal resistance value, $R_r$ denotes an internal resistance value after a lapse of the predetermined time, $R_i$ denotes an initial internal resistance value, $\alpha_x$ denotes a resistance increase coefficient of a predetermined condition x, and $t_x$ is a time during which the predetermined condition x has been held.

In the internal resistance estimation method according to the present embodiment, an increased amount of the internal resistance value is accurately and simply estimated by, for example, accumulating an amount of increase in resistance for each predetermined temperature and SOC condition of the secondary battery with the use of the following method by focusing on the above-described relationship. That is, in estimating an increased amount of the internal resistance value, described in this specification, the following first data are previously prepared for the standard secondary battery having the same specifications as the intended secondary battery. The first data are data that indicate the value of the resistance increase coefficient of the secondary battery in a predetermined temperature and SOC state. The resistance increase coefficient is a value that indicates the degree of increase per unit time in the resistance of the secondary battery placed under a predetermined condition. In other words, the resistance increase coefficient may be acquired as the rate of degradation due to an increase in the internal resistance of the secondary battery. A measured value for the standard secondary battery having the same specifications as the secondary battery that is the evaluation object may be employed as the resistance increase coefficient. The resistance increase coefficient is, for example, obtained in accordance with the following procedure.

Initially, by measuring the resistance value of a battery that has been stored at a predetermined temperature and SOC for a predetermined time, a resistance increase rate after storage for the predetermined time is obtained. For example, where the initial resistance is $R_0$ and the resistance after storage for a predetermined time (t) is $R_t$, for example, a value that is calculated from the mathematical expression $r_t=(R_t-R_0)/R_0 \times 100$ is employed as the resistance increase rate $r_t$. Subsequently, from data of the resistance increase rate $r_t$, calculated for various holding times, the resistance increase coefficient $\alpha$ that indicates temporal changes in the resistance increase rate $r_t$ is calculated. This resistance increase coefficient is calculated by, for example, calculating linear regression in which the time t is an independent variable and the resistance increase rate $r_t$ is a dependent variable. Specifically, typically, when the relationship between a resistance increase rate and a time is plotted where the X-axis represents the square root of a time ($\sqrt{t}$) and the Y-axis represents a resistance increase rate ($r_t$), the plot can be linearly regressed. The slope of the regression line is the resistance increase coefficient $\alpha$.

The first data are prepared by calculating the resistance increase coefficient $\alpha$ while variously changing the temperature and SOC condition. The first data may be prepared as numeric data or may be prepared as map data. Desirably, the resistance increase coefficient-temperature-SOC relationship is prepared in form of, for example, a three-dimensional map, or the like.

The resistance increase coefficient $\alpha$ depends on temperature and SOC. However, under the above-described endurance test condition, the resistance increase coefficient $\alpha$ can be more influenced by temperature than SOC. The relevance between the resistance increase coefficient $\alpha$ and the temperature is generally allowed to be expressed by Arrhenius equation. Therefore, in preparing the first data, for example, the resistance increase coefficient $\alpha$ is calculated at several different temperatures (for example, three or more temperatures), and the temperature dependency of the resistance increase coefficient of the battery is obtained on the basis of the Arrhenius equation. Thus, it is possible to minutely and simply obtain the resistance increase coefficient $\alpha$ in the temperature range. With the Arrhenius equation, the resistance increase coefficient $\alpha$ is expressed as the general expression $\alpha=A\times\exp(-E/RT)$, or the like. In the expression, A denotes constant not associated with temperature (frequency factor), E denotes activation energy, R denotes gas constant, and T denotes absolute temperature. The resistance increase coefficient $\alpha$ can more remarkably depend on temperature than on SOC as the environmental temperature decreases. Therefore, for example, when the environmental temperature is a low temperature that is about 10° C. or below, the resistance increase coefficient $\alpha$ is allowed to be treated as a characteristic that depends only on temperature. Hereinafter, for the sake of simplified description, a technique for calculating an increased amount of the internal resistance value will be described by way of an example in which the environmental temperature is lower than or equal to 10° C. and the resistance increase coefficient $\alpha$ does not depend on SOC and is influenced only by temperature.

The above-described first data and the above-described third data are not always limited to these; however, the first data and the third data are desirably data acquired for a standard battery that has not degraded, that is, a standard battery just after manufacturing or in an beginning of use. The beginning of use means an initial stage of use of the secondary battery that serves as an electric power supply source. That is, the beginning of use is desirably, for example, the timing at which the secondary battery (which can be the standard secondary battery) is in a state where no remarkable degradation is recognized. Therefore, for example, the first data and the third data are desirably acquired in a state where a secondary battery is constructed and is applied to predetermined conditioning process and aging process and then subjected to charging and discharging process of about one to ten times. The beginning of use may be set to the timing of the start of use of the battery by a user. For example, the beginning of use may be set to the timing at which estimation (evaluation) of the internal resistance of the secondary battery is started.

Subsequently, as shown in FIG. 2, an increased amount of the internal resistance value is estimated. The procedure of estimating an increased amount of the internal resistance includes (S210) calculating an integrated holding time; (S220) calculating an internal resistance value after a lapse of a predetermined time; and (S230) calculating an increased amount of the internal resistance value.

Initially, in S210, an integrated holding time during which the secondary battery is held in each predetermined temperature range is calculated for each predetermined temperature range on the basis of the acquired temperature course information. That is, in the present embodiment, for the sake of simplification, the case under the condition that an increase in the internal resistance due to SOC is allowed to be ignored will be described. The integrated holding time is specifically obtained by integrating a time during which the secondary battery is held in a predetermined temperature range for each temperature range. In this way, by organizing the temperature course information from the initial state as the integrated holding time (tm) in each temperature range ($\Delta$Tm), it is possible to simply handle the temperature course information of the battery over an extended period of time.

Subsequently, in S220, the internal resistance value of the secondary battery after a lapse of the predetermined time is calculated. The internal resistance value ($R_r$) of the secondary battery after a lapse of the predetermined time may be, for example, regarded as the one obtained by adding an amount of increase in the internal resistance to the internal resistance value at the beginning of use of the battery, that is, the initial internal resistance value ($R_i$). An amount of increase in the internal resistance is an amount of increase in the internal resistance value that is estimated to increase under a predetermined condition. For example, as shown in the following Table 1, an amount of increase in the internal resistance is simply calculated while taking a temperature course into consideration by separately calculating an amount of increase ($\Delta+R_r m$) in the internal resistance value for each of the above-described temperature ranges ($\Delta Tm$), and then adding the amounts of increase ($\Delta+R_r m$) in the internal resistance value for all the temperature ranges together. The temperature range ($\Delta Tm$) may be, for example, set for every 1 to 20° C., more desirably for every 1 to 15° C., particularly desirably for every 1 to 10° C., and, for example, for every 1 to 5° C.

TABLE 1

| Temperature Range | Integrated Holding Time | Resistance Increase Coefficient | Amount of Increase in Internal Resistance |
|---|---|---|---|
| $\Delta T_1$ | $t_1$ | $\alpha_1 = A \times \exp(E/T_1)$ | $\Delta + R_1$ |
| $\Delta T_2$ | $t_2$ | $\alpha_2 = A \times \exp(E/T_2)$ | $\Delta + R_2$ |
| $\Delta T_3$ | $t_3$ | $\alpha_3 = A \times \exp(E/T_3)$ | $\Delta + R_3$ |
| . | . | . | . |
| . | . | . | . |
| . | . | . | . |
| $\Delta Tm$ | $tm$ | $\alpha m$ | $\Delta + R_r m$ |

Calculation and summation of the amounts of increase in resistance ($\Delta+R_r m$) in the respective temperature ranges are desirably carried out in accordance with Miner's rule (linear cumulative damage rule). Miner's rule is generally known as a fatigue estimation method that is used at the time of evaluating the fatigue life of a member to which stresses having various amplitudes are randomly input. In Miner's rule, life is estimated on the assumption that a state where stresses having various amplitudes are randomly occurring is the sum of the stresses ($\sigma_1, \sigma_2, \ldots, \sigma_i$) that have different amplitudes and that are repeated solely. In the present embodiment, this idea is applied, and, for example, the degree of degradation, which takes an increase in the internal resistance due to the temperature course of the battery into consideration is evaluated with respect to a time (that is, an evaluation period). For example, a time during which the battery is exposed to a predetermined temperature range is added up as the integrated holding time (frequency distribution), and the degree of degradation to be accumulated is calculated as an amount of increase in the internal resistance in the predetermined temperature range.

Specifically, for example, amounts of increase in the resistance value in the respective temperature ranges are added together in accordance with Miner's rule as illustrated in the following procedure. That is, for example, specifically, an amount of increase ($\Delta+R_{r1}$) in the internal resistance value in a first temperature range ($\Delta Tm_1$) is initially calculated. For example, as one example, where an integrated holding time in the first temperature range ($\Delta T_1$) is $t_1$, an initial internal resistance value is $R_{i1}$ and a resistance increase coefficient corresponding to the first temperature range and extracted from the first data is $\alpha_1$, an internal resistance value $R_{r1}$ of the battery that has been held in the first temperature range ($\Delta T_1$) is calculated by multiplying the initial internal resistance value ($R_{i1}$) by the resistance increase coefficient ($\alpha_1$) and the integrated holding time ($t_1$) in the first temperature range. The amount of increase ($\Delta+R_{r1}$) in the resistance value in the first temperature range is calculated by subtracting the initial internal resistance value ($R_{i1}$) from the internal resistance value ($R_{r1}$) of the battery that has been held in the first temperature range ($\Delta T_1$).

Subsequently, an amount of increase ($\Delta+R_{r2}$) in the internal resistance value in a second temperature range ($\Delta T_2$) is calculated. In calculating an amount of increase ($\Delta+R_{r2}$) in the internal resistance value in the second temperature range, the internal resistance value ($R_{r1}$) of the battery that has been held in the first temperature range ($\Delta T_1$) is used as an initial internal resistance value ($Ri2$) in the second temperature range. That is, a calculation start reference is shifted on the assumption that degradation has advanced at the beginning of the second temperature range by an amount corresponding to the amount of increase ($\Delta+R_{r1}$) in the internal resistance value in the first temperature range. An internal resistance value ($R_{r2}$) of the battery that has been held in the second temperature range is calculated as the internal resistance value of the battery of which the internal resistance has been increased as a result of a temperature history in the first temperature range and the internal resistance value of the battery that has been held for an integrated holding time in the second temperature range. In this way, in adding the amounts of increase ($\Delta+R_r m$) in the internal resistance value in the respective temperature ranges together, integration is performed in consideration of a temperature history, so it is possible to simply and further highly accurately estimate an increased amount ($\Delta+R$) of the internal resistance value in all the temperature course ranges and, by extension, estimate the amount of degradation.

In S230, an increased amount ($\Delta+R$) of the internal resistance value is calculated by subtracting the initial internal resistance value ($R_i$) from the thus obtained internal resistance value ($R_r$) of the secondary battery after a lapse of the predetermined time. Although detailed description is omitted in the specification, an increased amount ($\Delta+R$) of the internal resistance value may be calculated in consideration of the influence of SOC. In this case, for example, an integrated holding time in a predetermined temperature range may be further divided as an integrated holding time in a predetermined temperature range and a predetermined SOC range, and an internal resistance value after a lapse of the predetermined time may be calculated by using a resistance increase coefficient at a temperature and an SOC. Specifically, for example, as shown in FIG. 5, amounts of increase in the internal resistance value in respective temperature ranges $T_1$, $T_2$, . . . are respectively added to the initial internal resistance values in respective SOC ranges. After that, an increased amount of the internal resistance value after a lapse of the predetermined time is calculated for each predetermined SOC range, and the increased amounts of the internal resistance value are added together over all the SOC ranges of use. With this configuration as well, an increased amount ($\Delta+R_r m$) of the internal resistance is obtained. According to the above mode, it is possible to further highly accurately estimate the degree of degradation. A detailed calculation technique of Miner's rule is known, so further detailed description is omitted.

In this way, by employing the technique according to the present embodiment, it is possible to simply calculate the internal resistance after a lapse of the predetermined time, which reflects the temperature history of the battery. An increased amount of the internal resistance is obtained by subtracting the initial internal resistance value ($R_i$) from the calculated internal resistance value after a lapse of the predetermined time. However, the technique for calculating an increased amount of the internal resistance value is not necessarily limited to the above-described example. For example, in calculating an increased amount of the internal resistance value, the internal resistance value ($R_r$) of the secondary battery after a lapse of the predetermined time may be directly calculated, a difference may be obtained by subtracting the initial internal resistance value ($R_{in}$) from the internal resistance value ($R_r$), and then the difference may be regarded as an increased amount ($\Delta + R_r$) of the internal resistance value. Other than these examples, for example, a method of calculating a further detailed increased amount of the internal resistance value, a further simplified calculation method, or the like, may be employed.

S300: Estimation of Reduced Amount of Internal Resistance Value

On the other hand, in S300, a reduced amount of the internal resistance value of the secondary battery resulting from a relative change in the range of use of the capacity between the positive electrode and the negative electrode after a lapse of the predetermined time is estimated on the basis of the above-described temperature course information. The relative change in the range of use of the capacity (capacity deviation) between the positive electrode and the negative electrode will be simply described. As described above, each of the positive electrode and the negative electrode includes a predetermined percentage of an active material. Depending on the crystal structure, composition, and the like, of an active material, a capacity that the active material is able to receive carriers and a potential corresponding to a state where carriers are captured are determined. The capacity and voltage of the battery are determined by the amount of a positive electrode active material, the amount of a negative electrode active material, a combination of the positive electrode active material and the negative electrode active material, and the like. Degradation of the battery can also be significantly influenced by individual degradation of each of the positive electrode and negative electrode, a gap in the degree of degradation between the positive electrode and the negative electrode, and the like.

Figure 6:
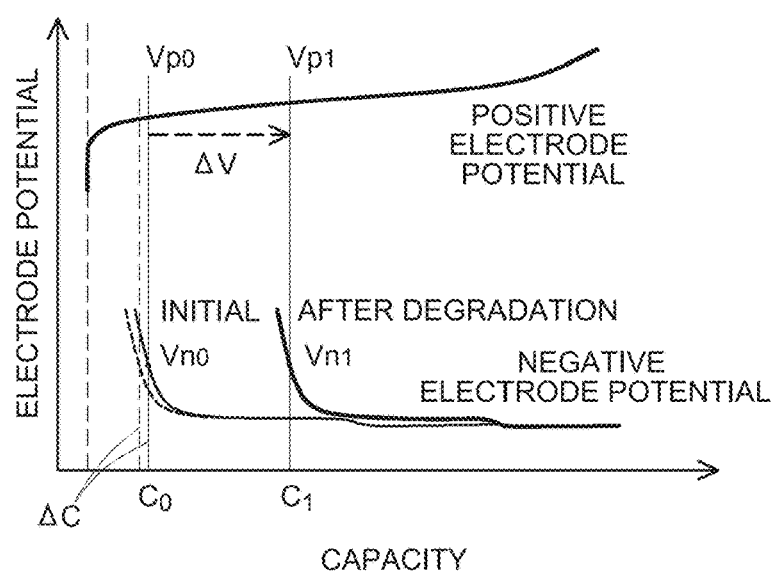
FIG. 6 is a view that illustrates the relationship between a charged capacity of a secondary battery and each of a positive electrode potential and a negative electrode potential in an initial stage of the secondary battery and a stage after a lapse of a predetermined time.

FIG. 6 is a view that schematically illustrates an open circuit potential curve of each of a positive electrode and a negative electrode. For example, as illustrated in FIG. 6, it is known that there occurs an irreversible capacity ($\Delta C$) in a lithium ion battery as a result of initial charging and discharging. Specifically, lithium ions that serve as carriers precipitate on the surface of the negative electrode and are, for example, inactivated, with the result that the battery capacity can decrease. A film is formed on the surface of the negative electrode as a result of decomposition of an electrolyte or a film forming agent that is added to the electrolyte, with the result that the internal resistance can increase. In addition, for example, when an oxalato complex compound is used as a film forming agent, it is also recognized that oxalic acid ions, for example, dissociate from the formed film and, as a result, the internal resistance of the battery can decrease again.

Figure 7:
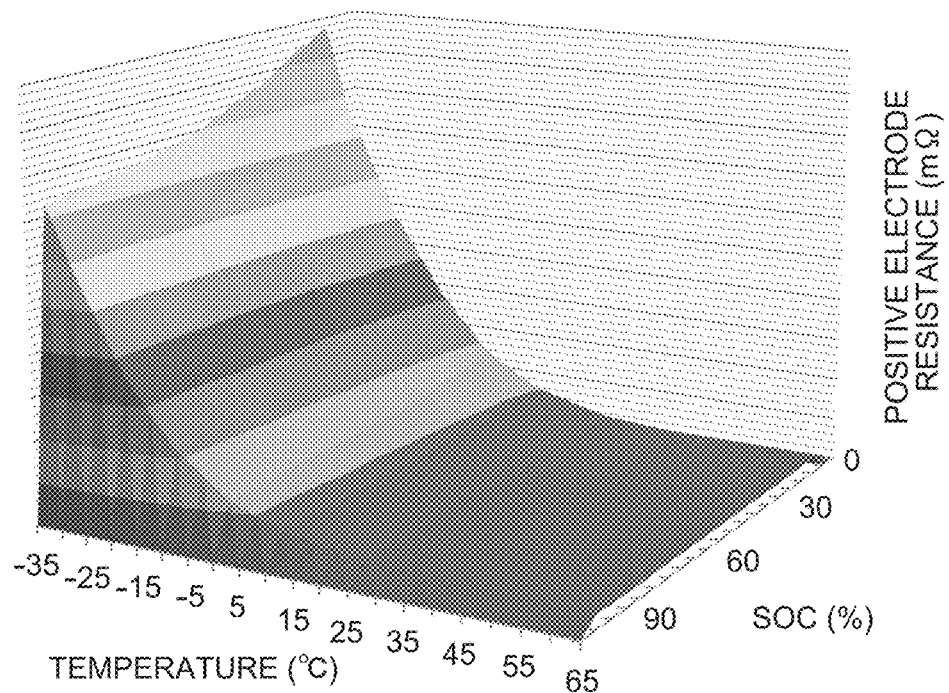
FIG. 7 is an example of a data map that shows the relationship among a temperature of the secondary battery, a state of charge (SOC) of the secondary battery and a positive electrode resistance at the temperature and the SOC.
Figure 8:
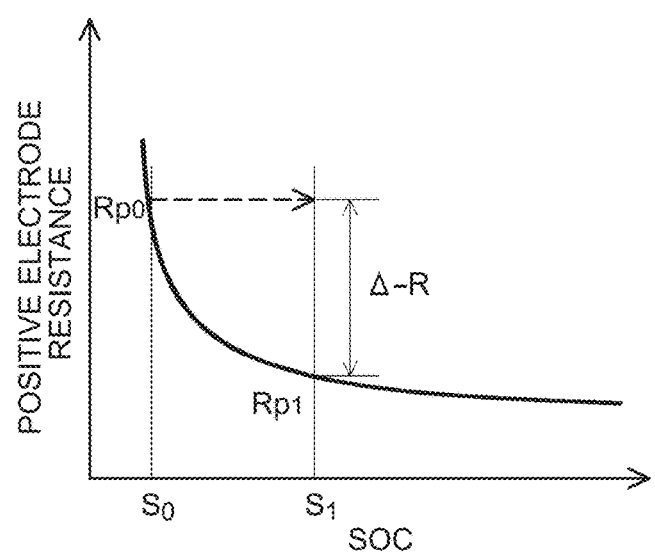
FIG. 8 is a view that illustrates the relationship between an initial SOC of the secondary battery and an initial resistance value of a positive electrode at a predetermined temperature.

In this way, as a result of use of the battery, the mode of degradation can vary between the positive electrode and the negative electrode or there can occur a gap in a state of combination. Then, the capacity dependency of the battery characteristics and the mode of increase in the internal resistance can also be influenced. For example, as the irreversible capacity of the negative electrode increases as a result of use of the battery, the negative electrode potential remains at $V_{n1}$ and does not return to an initial potential $V_{n0}$ in the last stage of discharging of the negative electrode. That is, in the example shown in FIG. 6, a negative electrode potential curve is considered to shift from the curve "initial" to the curve "after degradation". Initially, attention is focused on the positive electrode potential. Then, with a shift of the negative electrode potential curve, the lower limit of the charge and discharge potential of the positive electrode is shifted from an initial positive electrode potential $V_{p0}$ to a high potential-side $V_{p1}$. That is, the lower limit of the charge and discharge capacity of the positive electrode relatively deviates toward a high capacity side, that is, a high SOC side. FIG. 7 is a temperature-SOC-positive electrode resistance map that schematically shows the relationship among the temperature, SOC and positive electrode resistance value of the secondary battery. FIG. 8 is a graph that is clipped from FIG. 7 and that schematically shows the relationship between a positive electrode resistance and an SOC at a selected temperature. In FIG. 8, if the lower limit of the SOC during charging or discharging of the positive electrode shifts from $S_0$ to a high potential-side S1, the positive electrode does not need to be charged or discharged in a high resistance region, so the internal resistance can be decreased. For example, the initial resistance value ($R_{p0}$) of the positive electrode decreases to a degraded resistance value ($R_{p1}$) as a result of a shift of the lower limit value of the SOC.

In the technique described in this specification, by focusing on a reduced amount of the internal resistance value of the secondary battery resulting from such a capacity deviation between the positive electrode and the negative electrode, the reduced amount is taken into consideration in estimating the internal resistance. For example, FIG. 6 shows the potential curve of a negative electrode in the case where a negative electrode active material made of carbonaceous material is used. A positive electrode active material in this example is, for example, a lithium transition metal composite oxide that is expressed by general formula $Li(Ni_{1-a-b}Mn_aCo_b)O_2$ (a, b each are an independent real number larger than or equal to 0 and smaller than 1, and satisfy $0 \leq (a+b) < 1$). In such a negative electrode, when the potential curve of the negative electrode has shifted (degraded) to a high capacity side, the resistance value of the degraded negative electrode does not decrease so much. That is, a decrease in the resistance value of the negative electrode is allowed to be ignored. However, for example, as for a battery that uses such a negative electrode active material that, when the potential curve of the negative electrode has shifted (degraded) to a high capacity side, the resistance of the degraded negative electrode decreases, an amount of decrease in the resistance value is calculated as in the case of the positive electrode. Hereinafter, a technique for calculating an amount of decrease in the resistance value of the positive electrode will be described in detail.

That is, in estimating a reduced amount of the internal resistance value, described in this specification, as shown in <D2> and (S110) described below, second data and positive electrode potential history information as shown in FIG. 7 are previously prepared for the standard secondary battery having the same specifications as the intended secondary battery.

<D2> The second data are temperature-SOC-resistance data of the positive electrode, which show the relationship among a temperature and SOC of the standard secondary battery and a positive electrode resistance at each temperature and SOC in the initial stage of the positive electrode provided in the standard secondary battery. For example, in creating the first data, data regarding the positive electrode potential are sampled together. Thus, the second data are prepared. The positive electrode resistance is, for example, acquired by providing a reference electrode in the standard battery and then measuring a potential difference between the reference electrode and the positive electrode. The second data may be prepared as numeric data or may be prepared as map data. Desirably, the temperature-SOC-positive electrode resistance relationship is prepared in form of, for example, a three-dimensional map, or the like.

(S110) The positive electrode potential history information is data that include a positive electrode potential and time information about time at which the positive electrode potential is recorded for the secondary battery that is the evaluation object. For example, a positive electrode potential measured by, for example, introducing the reference electrode to one or two or more secondary batteries may be desirably employed as the positive electrode potential. For example, the positive electrode potential is measured by installing a reference electrode in a single battery or one or multiple batteries within a plurality of batteries (or battery stack), which are objects from which the above-described temperature course information is acquired. Thus, it is possible to acquire the positive electrode potential at any timing. When the positive electrode potential history information is acquired by the use of a known battery control system, the acquired positive electrode potential history information may be utilized. The positive electrode potential and the time information both just need to indicate a measured positive electrode potential and measured time, respectively. For example, the positive electrode potential and the time information each may be acquired as a difference from the last measured value, that is, a positive electrode potential difference from the last data, a time difference from the last data, or the like. The temperature course information should be acquired at the same timing as the above-described temperature course information from the start of evaluation.

The degree of degradation of the battery is acquired on the basis of a variation in the internal resistance value. This variation in the internal resistance is generally mainly caused by the positive electrode, and it is presumable that this variation in the internal resistance has appeared as a change in the internal resistance of the whole battery. Therefore, in order to further simplify estimation of the degree of degradation while substantially keeping the accuracy, the above-described third data may be used instead of the second data. That is, as for variations in the internal resistance value resulting from degradation, the characteristics of the positive electrode can be reflected in the characteristics of the whole battery, so the temperature-SOC-IV resistance data (third data) of the whole battery may be used. The third data may be used instead of the second data in all the temperature-SOC conditions, or may be used instead of the second data in part of the temperature-SOC conditions.

Subsequently, as shown in FIG. 3, a reduced amount of the internal resistance value is estimated in the following procedure.

(S310) Calculating the displacement of the positive electrode potential
(S320) Calculating a shift amount of an SOC lower limit value
(S330) Calculating a difference in the positive electrode resistance
(S340) Calculating a reduced amount of the internal resistance value Initially, in S310, the displacement of the positive electrode potential is calculated by subtracting the potential (initial potential) at the start of evaluation from the potential of the positive electrode after a lapse of the predetermined time (after degradation). The value of the positive electrode potential at a predetermined temperature and SOC, previously measured for the standard battery as the second data, is employed as the value of the initial potential. The displacement ($\Delta V$) of the positive electrode potential in the secondary battery that has been used for the predetermined time is, for example, expressed as a shift amount ($V_{p0}-V_{p1}$) that is a difference between the lower limit $V_{p1}$ of the charging and discharging potential of the degraded positive electrode and the lower limit $V_{p0}$ of the charging and discharging potential of the initial positive electrode as shown in FIG. 6. When the calculated displacement ($\Delta V$) of the positive electrode potential is a positive value, it is presumable that the usage minimum potential of the positive electrode is shifted to a high potential side and there occurs a reduced amount of the internal resistance. A reduced amount of the internal resistance value is calculated on the basis of the displacement ($\Delta V$) of the positive electrode potential. On the other hand, when the calculated displacement ($\Delta V$) of the positive electrode potential is a value smaller than or equal to zero, it may be determined that the lower limit of the charge and discharge potential of the positive electrode is not shifted to a high potential side, and it is presumable that there is no reduction in the internal resistance ($\Delta$-R=0).

The shift amount ($V_{p0}-V_{p1}$) of the lower limit of the charge and discharge potential of the positive electrode correlates with a shift amount of the lower limit of the charge and discharge capacity of the secondary battery, that is, a shift amount of the SOC lower limit value. In S320, when the displacement ($\Delta V$) of the positive electrode potential is a positive value, the lower limit S1 of the SOC of the degraded secondary battery is obtained in correspondence with the displacement ($\Delta V$), the lower limit S1 being a lower limit after the lower limit $S_0$ of the SOC of the secondary battery has been displaced. SOC 100% is a state of charge in a full charge state. SOC 0% is a state of charge in a full discharge state. The upper limit potential of the battery is associated with the upper limit value of the SOC. The lower limit potential of the battery is associated with the lower limit value of the SOC. The lower limit value of the SOC after a lapse of the predetermined time is, for example, acquired by measuring the amount of discharge from the full charge state to the potential ($V_{p1}$) at the end of discharging of the positive electrode. A shift amount ($\Delta SOC=S_1-S_0$) of the SOC lower limit value, corresponding to the displacement ($\Delta V$) of the positive electrode potential, is calculated by utilizing this relationship. A shift amount of the SOC lower limit value may be calculated as a difference between the SOC of the secondary battery at the beginning of use at the same potential as the lower limit $V_{p1}$ of the charge and discharge potential of the degraded positive electrode, and the SOC lower limit value of the secondary battery at the beginning of use.

Figure 10:
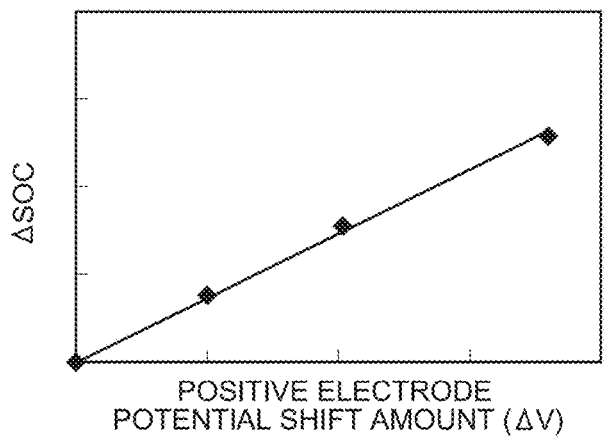
FIG. 10 is a view that illustrates the relationship between a shift amount ($\Delta V$) of a positive electrode potential and a shift amount ($\Delta SOC$) of an SOC lower limit value corresponding to the shift amount of the positive electrode potential.

The displacement ($\Delta V$) of the positive electrode potential and the corresponding shift amount ($\Delta SOC$) of the SOC lower limit value are typically in a linear correlation. Therefore, the correlation between the displacement ($\Delta V$) of the secondary battery that is the evaluation object and the shift amount ($\Delta SOC$) of the SOC lower limit value may be investigated in advance. FIG. 10 illustrates data showing the relationship between a displacement ($\Delta V$) and a shift amount ($\Delta SOC$) of the SOC lower limit value. In this way, for example, the relationship between a displacement ($\Delta V$) and a shift amount ($\Delta SOC$) of the SOC lower limit value is allowed to be prepared in form of graph, numeric data, function data, or the like (for example, referred to as fourth data). A shift amount ($\Delta SOC$) is obtained only by referencing the fourth data.

In a general charge and discharge control system for a secondary battery, for the purpose of safety measures and resistance reduction, control for restricting charging or discharging can be executed by setting the range of use of the SOC (charge and discharge range) of the battery such that the range of use of the SOC falls between a full charge condition and a full discharge condition. As an example of such battery control, for example, specifically, a charge end SOC is lowered or discharging is ended at a voltage higher than battery performance in order to prevent an expected battery depletion. For example, a shift of the positive electrode potential due to such an intentional restriction on the range of use of the SOC of the battery is also allowed to be reflected in the displacement ($\Delta V$) of the positive electrode potential.

In S330, a difference in the resistance value of the positive electrode, corresponding to the above-obtained shift amount ($\Delta SOC$) of the SOC lower limit value, is calculated. FIG. 8 corresponds to a cross section clipped from mapped third data at a predetermined temperature, and is a graph that illustrates the relationship between an SOC and an initial positive electrode resistance value at the predetermined temperature. For example, as shown in FIG. 8, it appears that as the SOC lower limit value increases (shifts) by $\Delta SOC$, the resistance of the positive electrode reduces from the initial resistance $R_{p0}$ to $R_{p1}$ accordingly. Therefore, a difference is obtained by subtracting the resistance ($R_{p1}$) after a shift of the SOC lower limit value from the initial resistance ($R_{p0}$). Subsequently, in S340, a reduced amount ($\Delta-R$) of the internal resistance value is calculated on the basis of the thus obtained difference in positive electrode resistance.

When a reduced amount of the internal resistance of the negative electrode is also calculated, the calculated reduced amounts of the internal resistances of the positive electrode and negative electrode are added together. Thus, a reduced amount ($\Delta-R$) of the internal resistance value of the secondary battery is obtained. When there is no reduced amount of the internal resistance of the negative electrode or a reduced amount of the internal resistance of the negative electrode is allowed to be ignored, from the viewpoint that the characteristics of the positive electrode can be reflected in the characteristics of the whole battery as for variations in the internal resistance value resulting from degradation, the above-obtained difference in positive electrode resistance is allowed to be directly employed as a reduced amount ($\Delta-R$) of the internal resistance value.

S400: Calculation of Internal Resistance Variation

In S400, the internal resistance variation ($\Delta R$) after a lapse of the predetermined time is calculated by adding the thus obtained increased amount ($\Delta+R$) and reduced amount ($\Delta-R$) of the internal resistance value.

S500: Acquisition of Estimated Internal Resistance Value

Of course, in S500, by adding the initial internal resistance value ($R_i$) to the internal resistance variation ($\Delta R$), the estimated internal resistance value, that is, the internal resistance value ($R_t$) after a lapse of the predetermined period, of the secondary battery is obtained. The thus calculated internal resistance variation ($\Delta R$) and estimated internal resistance value may also be used as indices that substantially reflect the degree of degradation of the battery. By extension, it is possible to estimate the degree of degradation of the secondary battery after a lapse of the predetermined time by sufficiently taking the temperature course information of the secondary battery into consideration.

In the above-described internal resistance estimation method for a secondary battery, estimation of the internal resistance variation of the secondary battery that is the evaluation object is allowed to be started at any timing. In other words, estimation of the degree of degradation of the secondary battery that is the evaluation object is allowed to be performed at any timing. Then, in using the secondary battery for an extended period of time, it is conceivable to estimate the degree of degradation of the secondary battery at multiple timings sequentially. In such a case, with reference to the internal resistance value after a lapse of the predetermined time, calculated in estimation of the degree of degradation last time, the degree of degradation from that reference may be estimated, and the degree of degradation from the beginning of use (for example, just after manufacturing) may be estimated by adding the calculated degree of degradation and the degree of degradation calculated last time together. That is, estimation of an internal resistance variation is allowed to be continued by setting the internal resistance value after a lapse of the predetermined time, calculated in estimation of the degree of degradation last time, as the initial internal resistance value ($R_i$).

For example, even when a different active material is used for the secondary battery, the above estimation method is slightly influenced as a result of a change in the active material; however, the above-described estimation method is similarly applicable. Even when a secondary battery includes an electrode in which a plurality of active materials are mixed, the estimation method is similarly applicable. According to the study of the inventors, as described above, a reduced amount of the internal resistance value resulting from a capacity deviation between the positive electrode and the negative electrode is taken into consideration in estimating an internal resistance variation, so the internal resistance variation ($\Delta R$) can be a negative value. This can mean that the battery has not degraded from the viewpoint of the internal resistance value. This can be the results that cannot be easily conceived of on the basis of common knowledge that degradation of a secondary battery advances with charging or discharging.

S600: Output Control Method for Secondary Battery

Figure 11A:
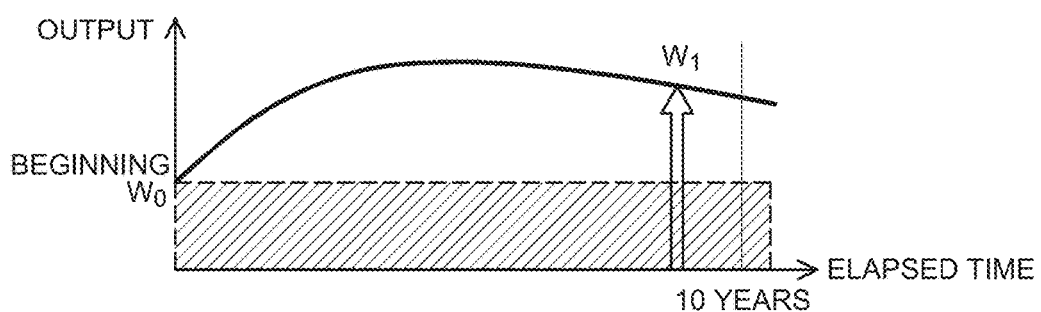
FIG. 11A is a view that illustrates an endurance time of the secondary battery and a change in output control over the secondary battery.
Figure 11B:
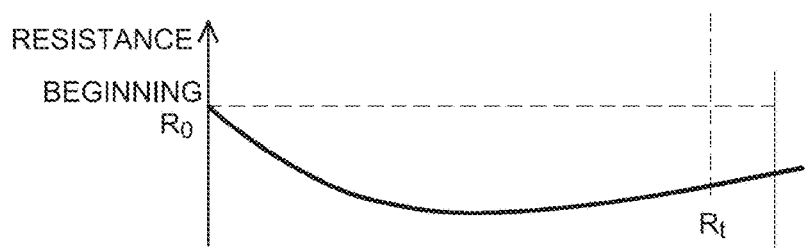
FIG. 11B is a view that illustrates an endurance time of the secondary battery and a change in the internal resistance R of the secondary battery.

In the present embodiment, an output control method that utilizes the above-described internal resistance estimation method for a secondary battery is provided. FIG. 11A is, for example, a graph that illustrates a time of use of a secondary battery that is used as a power supply for propelling a vehicle and a change in a controlled state of the output of the secondary battery. FIG. 11B is, for example, a graph that illustrates a time of use of a secondary battery that is used as a power supply for propelling a vehicle and a change in the internal resistance R of the secondary battery. For example, in an existing lithium ion secondary battery that is used as a power supply for propelling a vehicle, in order to secure a useful life of about ten years with consideration sufficiently given to safety, output control is generally executed such that the lithium ion secondary battery is used at an output lower than or equal to an initial output $W_0$ (see the shaded area). In contrast, in the control method according to the present embodiment, as shown in FIG. 4, where the internal resistance variation of the secondary battery after a lapse of the predetermined time, obtained as described above, is $\Delta R$, the output of the secondary battery is controlled as follows.

When $\Delta R > 0$ is satisfied, the output of the secondary battery is decreased.

When $\Delta R = 0$ is satisfied, the output of the secondary battery is kept.

When $\Delta R < 0$ is satisfied, the output of the secondary battery is increased.

That is, when the internal resistance variation $\Delta R$ is positive, the internal resistance value $R_t$ after a lapse of the predetermined time is larger than $R_0$ because the degradation of the secondary battery has advanced. In such a case, the output of the secondary battery is controlled in a decreasing direction. For example, when discharging is performed under the condition that the output of the secondary battery is higher than the initial output $W_0$, the output is suitably controlled so as to be a value lower than or equal to the initial output $W_0$. When the internal resistance variation $\Delta R$ is zero, the degradation of the secondary battery has not advanced, so the output of the secondary battery is kept. Alternatively, the output may be controlled slightly in a decreasing direction with consideration given to safety.

When the internal resistance variation $\Delta R$ is negative, the internal resistance value $R_t$ after a lapse of the predetermined time is larger than $R_0$. As shown in FIG. 11B, the internal resistance value $R_t$ after a lapse of the predetermined time is smaller than $R_0$. In such a case, the degradation of the secondary battery is prevented or reduced, so the output of the secondary battery is controlled in an increasing direction. That is, the secondary battery is allowed to be used at an output $W_1$ exceeding the initial output $W_0$ by increasing the output of the secondary battery as indicated by, for example, the continuous line in FIG. 11A. In a state where the internal resistance variation $\Delta R$ is negative, degradation does not excessively advances even when the output $W_1$ of the secondary battery is higher than or equal to the initial output $W_0$, and the secondary battery is allowed to be discharged in a further high output condition. It is presumable that using the secondary battery at the output $W_1$ higher than or equal to the initial output $W_0$ is a severer condition than usual. Therefore, when estimation of the degree of degradation is continued, and when the internal resistance variation $\Delta R$ that has been a negative value has changed to a positive value, it is desirable to immediately control the output to the initial output $W_0$ or below.

Output Control System for Secondary Battery

Figure 12:
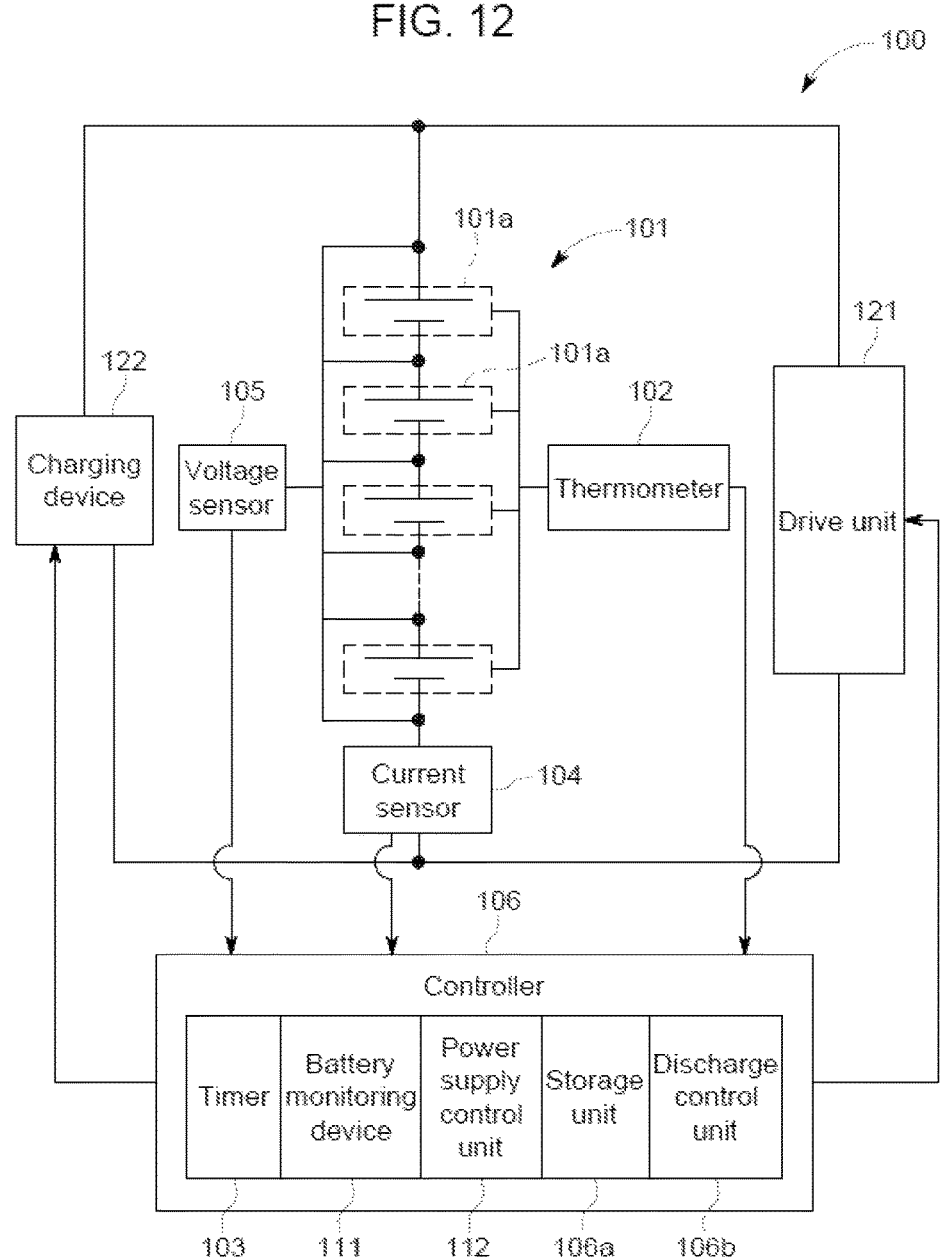
FIG. 12 is a view that illustrates an output control system for a secondary battery according to the embodiment.

Such an output control method for a secondary battery is implemented by utilizing, for example, a control system configured as described below. FIG. 12 is a block diagram that shows the configuration of the control system for a secondary battery according to the embodiment. The control system 100 for a secondary battery, for example, controls the output of a secondary battery 101 consisting of lithium ion secondary batteries, or the like, in consideration of the state of degradation of the secondary battery 101. The control system 100 typically includes the secondary battery 101, a thermometer (temperature measurement means) 102, a timer 103, a current sensor (current measurement means) 104, a voltage sensor (voltage measurement means) 105, and a controller 106. In the present embodiment, the timer 103 is provided inside the controller 106.

The control system 100 for a secondary battery may be, for example, integrally incorporated in a vehicle (for example, a hybrid vehicle, a plug-in hybrid vehicle, or the like) as a power supply for propelling the vehicle. For example, a hybrid vehicle not only includes an existing engine but also an electrical storage device and an electric motor, or the like, that generates the driving force of the vehicle by using electric power from the electrical storage device. When the secondary battery 101 is used as the electrical storage device and the output of the secondary battery 101 is supplied to a drive unit 121 formed of the electric motor, the control system 100 is able to appropriately control the output. Particularly, the secondary battery 101 mounted on the hybrid vehicle is required to supply high electric power to the motor at the time when the vehicle starts or accelerates, and is also required to store electric power that is generated by the motor (which functions as a charging device 122) at the time when the vehicle performs regenerative braking. For this reason, charge and discharge control is executed such that the SOC of the secondary battery 101 falls within a predetermined management range. The range of use of the SOC may be varied depending on the status of use of the battery such that the secondary battery is charged or discharged at a lower resistance. The control system 100 can be particularly suitably applied to the secondary battery 101 of which the range of use of the SOC can vary.

In FIG. 12, the secondary battery 101 is a battery pack in which a plurality of single cells 101a are connected in series with each other; however, the configuration of the secondary battery 101 is not limited. For example, the secondary battery 101 may be the single cell 101a or may be a battery pack, or the like, in which sets of the serially connected single cells 101a are further connected in parallel with each other.

Controller 106

The controller 106 controls charging and discharging of the lithium ion secondary battery 101. The controller 106, for example, includes a storage unit 106a and a discharge control unit 106b. The controller 106, for example, has an electrical storage function and an arithmetic processing function, and is able to execute various arithmetic processing in accordance with preset programs. The controller 106 is able to transmit a predetermined control signal for implementing control over the secondary battery 101, described in this specification.

For example, the controller 106 includes a battery monitoring device 111 and a power supply control unit 112. The battery monitoring device 111 monitors the secondary battery 101 (which may be the single cell 101a or the battery pack consisting of a predetermined number of the single cells 101a, and this also applies to the following description). The power supply control unit 112 is connected to the drive unit 121 via the discharge control unit 106b by the use of an electrical circuit (not shown). The drive unit 121 serves as a main output system for the secondary battery 101. The battery monitoring device 111 comprehensively monitors the state of the secondary battery 101. For example, the battery monitoring device 111 is configured to measure a battery temperature at intervals of a predetermined time with the use of the thermometer 102, and store the battery temperature information in the storage unit 106a in association with measurement time information acquired by the timer 103. The battery monitoring device 111 measures the positive electrode potential of the secondary battery 101 with the use of the voltage sensor 105 at intervals of a predetermined time, and stores the positive electrode potential information in the storage unit 106a in association with measurement time information. For example, when electric power that is generated by the charging device 122 at the time when the vehicle performs regenerative braking, or the like, is stored in the secondary battery 101, the battery monitoring device 111 is able to obtain charging information. The power supply control unit 112 is, for example, able to control charging or discharging of the secondary battery 101 such that the SOC of the secondary battery 101 falls within a predetermined management range.

The storage unit 106a is, for example, able to store the first data regarding the resistance increase coefficient, the second data regarding the temperature-SOC-positive electrode resistance map of the standard secondary battery, the third data regarding the initial battery temperature-SOC-IV resistance value map of the standard secondary battery, the fourth data indicating the relationship between the displacement (ΔV) of the positive electrode potential and the shift amount (ΔSOC) of the SOC lower limit value, and the temperature course information, positive electrode potential information, and the like, of the battery. For example, the power supply control unit 112 calculates the internal resistance variation ΔR of the lithium ion secondary battery 101 by freely accessing acquired data and stored data in accordance with the above-described procedure. Thus, the power supply control unit 112 is able to estimate the degree of degradation of the secondary battery. The power supply control unit 112 is able to issue a command to the discharge control unit 106b by setting the output condition of the secondary battery 101 on the basis of the internal resistance variation ΔR such that the battery output becomes an appropriate value.

For example, as an example, when the internal resistance variation ΔR is zero or a positive value, the discharge control unit 106b is able to issue a command to the drive unit 121 to control the discharge current such that the output detected by the current sensor 104 and the voltage sensor 105 is reduced. For example, when the internal resistance variation ΔR is a negative value, the discharge control unit 106b is able to issue a command to the drive unit 121 to control the discharge current such that the output detected by the current sensor 104 and the voltage sensor 105 is increased.

The embodiments of the invention are described in detail above; however, these are only illustrative, and are not intended to limit the invention. The technique according to the invention encompasses various modifications and alterations within the scope of the concept of the invention.

What is claimed is:

1. An output control and internal resistance estimation method for a secondary battery, the internal resistance estimation method being a method of estimating an internal resistance value of the secondary battery including a positive electrode and a negative electrode, comprising:
    acquiring an initial internal resistance value of the secondary battery;
    monitoring the secondary battery to acquire temperature course information, the temperature course information including a battery temperature of the secondary battery at least during use of the secondary battery and time information about time at which the battery temperature has been recorded;
    periodically acquiring and storing the temperature course information;
    repetitively estimating an increased amount of the internal resistance value of the secondary battery, after a lapse of a predetermined time, on the basis of the stored temperature course information;
    repetitively estimating a reduced amount of the internal resistance value of the secondary battery resulting from a relative change between a range of use of a state of charge of the positive electrode and a range of use of a state of charge of the negative electrode, after the lapse of the predetermined time, on the basis of the stored temperature course information;
    repetitively calculating an internal resistance variation in the lapse of the predetermined time, on the basis of the increased amount and the reduced amount of the internal resistance value; and
    adjusting an output of the secondary battery, based on the internal resistance variation.

2. The output control and internal resistance estimation method according to claim 1, further comprising
    preparing first data about a standard secondary battery, the first data indicating a relationship among a temperature, a state of charge, and a resistance increase coefficient, wherein
    the estimating the increased amount of the internal resistance value includes
        calculating an integrated holding time of the secondary battery for each predetermined temperature, on the basis of the temperature course information, and
        calculating an internal resistance value of the secondary battery after the lapse of the predetermined time is calculated on the basis of the integrated holding time at the predetermined temperature, the resistance increase coefficient at the predetermined temperature, and the state of charge included in the first data, and the increased amount of the internal resistance value is calculated on the basis of the calculated internal resistance value after the lapse of the predetermined time and the initial internal resistance value.

3. The output control and internal resistance estimation method according to claim 2, wherein
    the estimating the increased amount of the internal resistance value includes
        calculating the internal resistance value of the secondary battery after the lapse of the predetermined time from a reference time by using an integrated amount of a holding time at each temperature and the resistance increase coefficient at each temperature, and
        obtaining the increased amount of the internal resistance value on the basis of the internal resistance value of the secondary battery after the lapse of the predetermined time from the reference time, and the initial internal resistance value.

4. The output control and internal resistance estimation method according to claim 1, wherein
    the temperature course information is acquired during (1) a period during which the secondary battery is used, and one or more of following periods (2) to (4):
    (2) a selected period from an end of use of the secondary battery, which is within a nonuse period of the battery;
    (3) when a temperature difference between a maximum air temperature and a minimum air temperature of a day is larger than or equal to 10° C.; and
    (4) when a variation in average temperature of a month is larger than or equal to 5° C.

5. The output control and internal resistance estimation method according to claim 2, further comprising
    preparing second data about a positive electrode of the standard secondary battery, the standard secondary battery having the same specifications as the secondary battery, and the second data indicating a relationship among a temperature of the standard secondary battery, a state of charge of the standard secondary battery, and a resistance of the positive electrode; and
    acquiring positive electrode potential history information about the positive electrode of the secondary battery, the positive electrode potential history information including a potential of the positive electrode at least during use of the secondary battery and time information about time at which the potential of the positive electrode is recorded, wherein
    the estimating the reduced amount of the internal resistance value includes calculating a displacement of the potential of the positive electrode after the lapse of the predetermined time by subtracting an initial potential of the positive electrode from a potential of the positive electrode after the lapse of the predetermined time, when the displacement of the potential of the positive electrode of the secondary battery is a positive value, calculating a shift amount of a state of charge lower limit value of the secondary battery on the basis of the displacement of the potential of the positive electrode, and obtaining a difference by subtracting a shifted resistance value of the positive electrode when the state of charge of the secondary battery has increased by the shift amount of the state of charge lower limit value, from the initial resistance value of the positive electrode in the positive electrode potential history information, on the basis of the second data.

6. The output control and internal resistance estimation method according to claim 2, further comprising preparing second data including a relationship among the temperature of the standard secondary battery, a state of charge of the standard secondary battery and a resistance value of a positive electrode of the standard secondary battery, the standard secondary battery having the same specification as the secondary battery; and acquiring positive electrode potential history information including a potential of the positive electrode of the secondary battery during use of the secondary battery and time information about time at which the potential of the positive electrode of the secondary battery is recorded, wherein the estimating the reduced amount of the internal resistance value includes calculating a shift amount of a lower limit value of the state of charge of the secondary battery in the lapse of the predetermined time by subtracting a state of charge of the secondary battery at a reference time in a state where the potential of the positive electrode of the secondary battery is at a lower limit, from a state of charge of the secondary battery after the lapse of the predetermined time in a state where the potential of the positive electrode of the secondary battery is at the lower limit; and obtaining a difference, as the reduced amount of the internal resistance value, by subtracting a resistance value of the positive electrode of the secondary battery when the state of charge of the secondary battery has increased by the shift amount from a resistance value of the positive electrode of the secondary battery at the reference time, on the basis of the second data.

7. The output control and internal resistance estimation method according to claim 1, further comprising:

decreasing an output of the secondary battery in response to a determination that the internal resistance variation is positive;

keeping the output of the secondary battery in response to a determination that the internal resistance variation is zero; and increasing the output of the secondary battery in response to a determination that the internal resistance variation is negative.

8. A secondary battery output control system comprising:
a secondary battery that serves as a power supply for propelling a vehicle;
a thermometer;
a current sensor;
a voltage sensor; and
an output control circuit configured to execute output control over the secondary battery, wherein the output control circuit comprises:
a timer;
a storage unit configured to store an initial internal resistance value of the secondary battery and temperature course information, the temperature course information including a battery temperature of the secondary battery at least during use of the secondary battery and time information about time at which the battery temperature has been recorded;
a battery monitoring device configured to periodically acquire the temperature course information;
a power supply control unit configured to repetitively estimate an increased amount of the internal resistance value of the secondary battery, after a lapse of a predetermined time, on the basis of the stored temperature course information, repetitively estimate a reduced amount of the internal resistance value of the secondary battery resulting from a relative change between a range of use of a state of charge of the positive electrode and a range of use of a state of charge of the negative electrode, after the lapse of the predetermined time, on the basis of the stored temperature course information, and repetitively calculate an internal resistance variation in the lapse of the predetermined time, on the basis of the increased amount and the reduced amount of the internal resistance value; and
a discharge control unit configured to adjust an output of the secondary battery, based on the internal resistance variation.

9. A secondary battery output control system comprising:
a means for monitoring the secondary battery and periodically acquiring temperature course information, the temperature course information including a battery temperature of the secondary battery at least during use of the secondary battery and time information about time at which the battery temperature has been recorded;
a means for storing an initial internal resistance value of the secondary battery and the temperature course information;
a means for repetitively estimating an increased amount of the internal resistance value of the secondary battery, after a lapse of a predetermined time, on the basis of the stored temperature course information, repetitively estimating a reduced amount of the internal resistance value of the secondary battery resulting from a relative change between a range of use of a state of charge of the positive electrode and a range of use of a state of charge of the negative electrode, after the lapse of the predetermined time, on the basis of the stored temperature course information, and repetitively calculating an internal resistance variation in the lapse of the predetermined time, on the basis of the increased amount and the reduced amount of the internal resistance value; and
a means for controlling the output of the secondary battery, based on the internal resistance variation.

* * * * *